United States Patent
Uraki

(10) Patent No.: US 7,905,579 B2
(45) Date of Patent: *Mar. 15, 2011

(54) SHEAR MODE-TYPE PIEZOELECTRIC ACTUATOR AND LIQUID DROPLET EJECTION HEAD

(75) Inventor: Shingo Uraki, Machida (JP)

(73) Assignee: Konica Minolta Holdings, Inc., Tokyo (JP)

( * ) Notice: Subject to any disclaimer, the term of this patent is extended or adjusted under 35 U.S.C. 154(b) by 100 days.

This patent is subject to a terminal disclaimer.

(21) Appl. No.: 12/310,505

(22) PCT Filed: Aug. 2, 2007

(86) PCT No.: PCT/JP2007/065150
§ 371 (c)(1),
(2), (4) Date: Feb. 26, 2009

(87) PCT Pub. No.: WO2008/029573
PCT Pub. Date: Mar. 13, 2008

(65) Prior Publication Data
US 2010/0002060 A1    Jan. 7, 2010

(30) Foreign Application Priority Data
Sep. 8, 2006 (JP) .................. 2006-244028

(51) Int. Cl.
*B41J 2/045* (2006.01)
(52) U.S. Cl. .................................. 347/69
(58) Field of Classification Search ............ 347/69, 347/68, 70–72; 310/311, 324, 358, 360; 400/124.14, 124.16
See application file for complete search history.

(56) References Cited

U.S. PATENT DOCUMENTS

| | | | |
|---|---|---|---|
| 6,083,415 A | 7/2000 | Kimura et al. | |
| 2004/0058797 A1 | 3/2004 | Nonoyama et al. | |
| 2004/0241501 A1 | 12/2004 | Kijima et al. | |
| 2007/0008388 A1 | 1/2007 | Yamaguchi et al. | |

FOREIGN PATENT DOCUMENTS

| EP | 1 457 471 A2 | 9/2004 |
|---|---|---|
| EP | 1 457 471 A3 | 9/2004 |
| JP | 08-309979 A | 11/1996 |
| JP | 2004-244300 A | 9/2004 |
| JP | 2004-244301 A | 9/2004 |
| JP | 2004-300012 A | 10/2004 |
| JP | 2005-246656 A | 9/2005 |

OTHER PUBLICATIONS

U.S. Appl. No. 12/310,500, filed Feb. 26, 2009, Confirmation No. 6546.

*Primary Examiner* — K. Feggins
(74) *Attorney, Agent, or Firm* — Holtz, Holtz, Goodman & Chick, P.C.

(57) ABSTRACT

This invention provides a shear mode-type piezoelectric actuator using a piezoelectric ceramic composition free from lead having a high coercive electric field and a liquid ejection head having the shear mode-type piezoelectric actuator. The shear mode-type piezoelectric actuator is characterized by using a piezoelectric ceramic composition having a solid solution including a main component of general formula (1) and an auxiliary component of general formula (2) added in an amount of less than 1% by mole based on the total amount of the solid solution:

$\{Li_x(K_{1-y}Na_y)_{1-x}\}(Nb_{1-z-w}Ta_zSb_w)O_3$    General formula (1)

(Wherein $0 \leq x \leq 0.2$, $0 \leq y \leq 1$, $0 < z \leq 0.4$, $0 < w \leq 0.2$)

$ABO_3$    General formula (2)

(Wherein A denotes Bi and B denotes at least one of Fe, In and Sc).

6 Claims, 2 Drawing Sheets

↑ POLARIZATION
--→ ELECTRIC FIELD
↗ SHARING STRESS

SHEAR MODE-TYPE PIEZOELECTRIC ACTUATOR AND LIQUID DROPLET EJECTION HEAD

This application is the United States national phase application of International Application PCT/JP2007/065150 filed Aug. 2, 2007.

FIELD OF THE INVENTION

The present invention relates to a shear mode-type piezoelectric actuator and a liquid droplet ejection head.

PRIOR ART

As a piezoelectric ceramic composition, a ceramic composition PZT ($PbTiO_3$—$PbZrO_3$) including lead has been used. The PZT has a high voltage performance and a high mechanical quality factor, thereby being capable of readily producing materials having various characteristics required for various applications such as sensors, actuators and filters. Also, the PZT can be used for a condenser since it has a high relative permittivity.

Though the piezoelectric ceramic composition composed of the PZT has superior characteristics, contrarily since it contains lead as the component, there has been danger that the hazardous lead leaks out from industrial waste products containing the lead and causes environment pollution. Recent growing awareness of the environment pollution has been making manufacturing of products such as PZT may cause environment pollution difficult. Thus a piezoelectric ceramic compositions having a main component described by a general formula of $\{Li_X(K_{1-Y}Na_Y)_{1-X}\}(Nb_{1-Z-W}Ta_ZSb_W)O_3$, wherein X to W are in composition ranges of $0 \leq x \leq 0.2$, $0 \leq y \leq 1$, $0 < z \leq 0.4$, and $0 < w \leq 0.2$ are being developed. (Patent document 1: Unexamined Japanese Patent Application Publication No. 2004-300012)

Also, in Patent document 2 (Unexamined Japanese Patent Application Publication No. 2005-246656), a liquid droplet ejection head using a push type piezoelectric actuator including a piezoelectric ceramic composition having a perovskite type crystal structure excluding lead is disclosed. The push type piezoelectric actuator utilizes a displacement in a d33 direction or a displacement in a d31 direction. As the main component, barium titanate, potassium niobate, bismuth sodium titanate, nickel bismuth titanate, $Ba_2NaNb_5O_{15}$, and $Bi_4Ti_3O_{12}$ are disclosed.

Patent document 1: Unexamined Japanese Patent Application Publication No. 2004-300012

Patent document 2: Unexamined Japanese Patent Application Publication No. 2005-246656

DISCLOSURE OF THE INVENTION

Problems to be Solved by the Invention

There are suggested various methods of liquid droplet ejection heads. A liquid droplet ejection head provided with the shear mode-type piezoelectric actuator is one of them.

The above liquid ejection head is provided with a plurality of liquid flow paths, each having a nozzle for liquid ejection respectively, divided by dividing walls. An entire surface or a portion of a surface of the dividing wall is configured with the shear mode-type piezoelectric actuator and an electrode to apply a drive pulse is formed on the entire surface or the portion of the surface of the dividing wall thereof. By applying the drive pulse onto the electrode, shear deformation is caused on the dividing wall, a pressure inside the liquid flow path changes and a liquid droplet is ejected from the nozzle formed at an end of the liquid flow path.

However, there has been a following problem, in case the above piezoelectric ceramic composition is used as the shear mode-type actuator, since the piezoelectric ceramic composition described in the Patent documents 1 and 2 not having lead has a low coercive electric field.

In the above shear mode-type piezoelectric actuator, since a voltage is applied perpendicular to a polarization direction of the piezoelectric actuator, depolarization is caused when a strong electric field in a level of a coercive electric field is applied. Then displacement performance is deteriorated. Therefore, when a piezoelectric ceramic composition having a low coercive electric-field is used, a thickness of the dividing wall to which an electric field is applied had to be not less than a specific value, thus a nozzle density has not been able to increase. In addition, there has been a problem that if the thickness of the dividing wall is thick, a resonance frequency decreases.

The present invention is to solve the above problem. An object of the present invention is provide a shear mode-type piezoelectric actuator using a piezoelectric ceramic composition having a high coercive electric field not having lead and a liquid droplet ejection head provided with the shear mode-type piezoelectric actuator.

Means to Solve the Problems

The above object of this invention can be achieved by the following structures.

(1) A shear mode-type piezoelectric actuator having a piezoelectric ceramic composition including a solid solution composed of a main component described by a following general formula (1) and an auxiliary component described by a following general formula (2) added in an amount of less than 1% by mole based on a total amount of the solid solution.

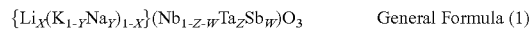

$\{Li_X(K_{1-Y}Na_Y)_{1-X}\}(Nb_{1-Z-W}Ta_ZSb_W)O_3$   General Formula (1)

(Wherein $0 \leq x \leq 0.2$, $0 \leq y \leq 1$, $0 < z \leq 0.4$, $0 < w \leq 0.2$)

$ABO_3$   General Formula (3)

(Wherein A denotes Bi and B denotes at least one of Fe, In and Sc)

(2) The shear mode-type piezoelectric actuator of structure (1), wherein the solid solution has a perovskite structure.

(3) A liquid droplet ejection head, comprising the shear mode-type piezoelectric actuator of structure 1 or 2.

(4) The liquid droplet ejection head of structure 3, further having a plurality of liquid paths divided by dividing walls, wherein each liquid path has a nozzle to eject the liquid droplet and the dividing wall is configured with the shear mode-type piezoelectric actuator.

Effect of the Invention

According to the shear mode-type piezoelectric actuator of the present invention, by adding the auxiliary component, described by $ABO_3$ perovskite (wherein A denotes Bi and B denotes at least one of Fe, In and Sc), in an amount of less than 1% by mole based on a total amount of the solid solution to the piezoelectric ceramic composition of $\{Li_X(K_{1-Y}Na_Y)_{1-X}\}(Nb_{1-Z-W}Ta_ZSb_W)O_3$ (wherein $0 \leq x \leq 0.2$, $0 \leq y \leq 1$, $0 < z \leq 0.4$, $0 < w \leq 0.2$) so as to be a solid solution, the coercive electric field of the piezoelectric ceramic composition to be obtained can be enhanced. Thereby the drive voltage applied to the shear mode-type piezoelectric actuator using the piezoelectric ceramic composition can be increased so as to increase a maximum displacement. In addition, since the thickness of the shear mode-type piezoelectric actuator can be reduced, the frequency of resonance can be increased, thus high frequency drive is possible. Also, since the thickness of the shear mode-type piezoelectric actuator can be reduced, a displacement efficiency is enhanced.

Also, According to the liquid droplet ejection head provided with the shear mode-type piezoelectric actuator of the present invention, the maximum displacement can be increased by increasing the drive voltage to be applied to the shear mode-type piezoelectric actuator. Further, since the thickness of the shear mode-type piezoelectric actuator can be reduced, the frequency of resonance of the actuator can be increased, thus high frequency drive is possible. In addition, since the thickness of the shear mode-type piezoelectric actuator can be reduced, the displacement efficiency is enhanced. Also, in case the shear mode-type piezoelectric actuator is used as the dividing wall of the liquid flow path, since the thickness of the dividing wall can be reduced, the nozzle density can be increased.

DESCRIPTION OF THE SYMBOLS

Figure 1:
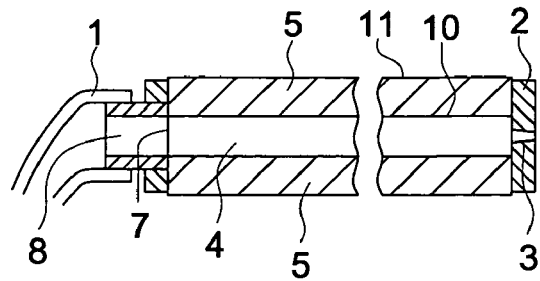
FIG. 1 shows a structure of a liquid droplet ejection head of a first embodiment of the present invention.

1 Ink tube
2 Nozzle forming member
3 Nozzle
4, 4-1, 4-2 to 4-*n* Ink flow path
5, 22-1, 22-2, to 22-*n* Side wall
6 Cover plate
7 Ink supply port
8 Ink discharge port
9 Substrate

DESCRIPTION OF THE PREFERRED EMBODIMENT

An embodiment of a shear mode-type piezoelectric actuator and a liquid droplet ejection head provided with the shear mode-type piezoelectric actuator related to the present invention will be described.

The shear mode-type piezoelectric actuator of the present embodiment is characterized in that a piezoelectric ceramic composition including a solid solution composed of a main component described by the following general formula (1) and an auxiliary component described by the following general formula (2) added in an additive amount of less than 1% by mol based on a total amount of the solid solution.

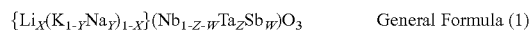

General Formula (1)

(Wherein $0 \leq x \leq 0.2$, $0 \leq y \leq 1$, $0 < z \leq 0.4$, $0 < w \leq 0.2$)

General Formula (2)

(Wherein A denotes Bi and B denotes at least one of Fe, In and Sc)

First, an embodiment of the piezoelectric ceramic composition of the present invention will be described.

Each composition will be described as follow.

The main component of the present embodiment is described by the above general formula (1). Here, in case $x > 0.2$, $z > 0.4$, $w > 0.2$, $z = 0$, or $w = 0$, a piezoelectric property such as a piezoelectric constant and a dielectric property are deteriorated, and the piezoelectric ceramic composition having desired characteristics cannot be obtained.

Such main component is obtained by thoroughly mixing an ingredient including each metallic element by ball mill. The ingredients of the main component are generally $Li_2CO_3$, $Li_2O$, $LiNO_3$, and $LiOH$ as compositions including Li, $Na_2CO_3$, $NaHCO_3$, and $NaNO_3$ as compositions including Na, $K_2CO_3$, $KNO_3$, $KNbO_3$ and $KTaO_3$ as compositions including K, $Nb_2O_5$, $Nb_2O_3$, and $NbO_2$ as compositions including Nb, $Ta_2O_5$ as a composition including Ta, and $Sb_2O_5$, $Sb_2O_3$ and $Sb_2O_4$ as compositions including Sb.

The main component has a perovskite structure ($ABO_3$), an elemental structure of A site is equivalent to K, Na and Li and an elemental structure of B site is equivalent to Nb, Ta and Sb.

In a composition formula of the perovskite structure, when a stoichiometric proportion of atomic elements configuring A site and B site is 1:1, the perovskite structure is an absolute perovskite structure, however in case of the piezoelectric ceramic composition in particular, K, Na, Li and Sb volatilize several percentage in a sintering process or all construction elements may fluctuate several percent in processes of mixing pulverization and pelletization. Namely variations in production method may cause a variation of the stoichiometric composition.

To cope with the composition variation in the production process, by varying a dispense composition ratio-intentionally, a composition ratio of the piezoelectric ceramic composition can be varied several percent, specifically ±3 to 5%. The foregoing can be applied to, for example, conventional lead zirconate titanate (PZT), and the composition ratio can be adjusted considering volatilizing of lead at sintering and commingling of zirconia from a zirconia ball representing a pulverization medium.

In the piezoelectric ceramic composition including the main component in the present embodiment, an electrical characteristic such as the piezoelectric property can not be changed to a large extent even if the composition ration is changed intentionally as above. Thus, in the present invention, when the main component is applied to the composition formula of the perovskite structure, the composition rations of A site atomic element and B site atomic element can be respectively deviated to an extent of ±5% by mol from 1:1. Meanwhile, to minimize lattice defects in crystals formed and to obtain a high electric characteristic, the composition ratio can be deviated preferably to an extent of ±3%. Namely, in the main component having a structure described by the general formula of $\{Li_X(K_{1-Y}Na_Y)_{1-X}\}a(Nb_{1-Z-Y}Ta_ZSb_W)bO_3$, $0.95 \leq a$, $b \leq 1.05$ and preferably $0.97 \leq a$, $b \leq 1.03$ are to be satisfied.

Also, in the main component described by the above general formula, $0 < x \leq 0.2$ is preferred. Thereby, since Li becomes an essential component, sintering to obtain the piezoelectric ceramic composition can be carried out further readily, and the piezoelectric character can be further enhanced, then a curie temperature Tc can be further increased. Because, sintering with less holes is realized where sintering temperature is decreased and Li serves as an auxiliary agent by including Li as an essential component within the above range.

Also, in the main component described by the above general formula, $x=0$ is possible. In this case, the main component is described by $(K_{1-Y}Na_Y)(Nb_{1-Z-W}Ta_ZSb_W)O_3$. Since a piezoelectric ceramic composition having such main component does not include a compound composed of a lightest Li such as, for example, $Li_2CO_3$, in the ingredient, the variation of characteristic due to segregation of the ingredient powder when the piezoelectric ceramic composition is produced by mixing the ingredient can be minimized. Also, a high relative permittivity Er and a relatively large piezoelectric constant can be realized.

Also, to further enhance the piezoelectric constant and an electromechanical coupling coefficient of the piezoelectric ceramic composition to be obtained, $0 \leq y \leq 0.85$ is preferred, and $0.05 \leq y \leq 0.75$ or $0.35 \leq y \leq 0.65$ is further preferable. Also, $0.42 \leq y \leq 0.60$ is most preferable.

Also, in the main component described by the above general formula, y=0 is possible. In this case, an electric loss and a long term stability of the electric loss can be enhanced since Na is not included in the main component.

Further, in the main component described by the above general formula, $z+w \leq 0.37$ is preferred. In this case, the piezoelectric characteristic such as the piezoelectric constant can be further enhanced.

Next, the auxiliary component of the present embodiment will be described.

The auxiliary component of the present embodiment described by the general formula $ABO_3$ are a $ABO_3$ type perovskite compound where A and B are trivalent metal elements. A in the auxiliary component represents Bi element and B includes at least one of Fe, In and Sc. An additive amount of the auxiliary component is less than 1 mol in respect to a total amount after adding (the main component+ the auxiliary component) of 100 mol.

As the auxiliary component described by the general formula (2), a compound composing the $ABO_3$ type perovskite compound can be added to the main component. Also, in a course of process to mix with the main component, Ingredients representing the $ABO_3$ type perovskite compound can be added in combination. $BiInO_3$, $BiFeO_3$ and $BiScO_3$ can be cited as the compound to configure $ABO_3$ type perovskite structure in advance.

Also, as the ingredient to be the $ABO_3$ type perovskite compound in the mixing process, as the compound including Bi, $Bi_2O_3$, as the compound including In, $In_2O_3$, as the compound including Sc, $Sc_2O_3$, and as the compound including Fe, $Fe_2O_3$ are cited. The above ingredient is preferred more than 99% in purity.

Also, the auxiliary component of the present embodiment is the $ABO_3$ type perovskite compound where the atomic element configuring A site is Bi, and the atomic element configuring B site is at least one of Fe, In and Sc, and B site can be configured with combination of more than two kinds of metal elements without being limited to one kind of metal element.

Further, the atomic elements to configure A site and B site can be dispensed in a stoichiometric proportion of 1:1 so that the ingredient of the auxiliary component becomes $ABO_3$, and the stoichiometric proportion can be varied by several percent considering variations in the manufacturing process such as volatile in the sintering process.

Next, a manufacturing method of the piezoelectric ceramic composition of the present embodiment will be described. As the manufacturing method of the piezoelectric ceramic composition of the present embodiment, a manufacturing method through solid phase thermochemical reaction will be described without being limited the method thereto in particular.

First, ingredients for the main component are prepared and thoroughly dried. Weight of each ingredient after drying is measured based on the stoichiometric proportion of each ingredient after drying and each ingredient is mixed with the ball mill. Subsequently, the mixture is calcined at a temperature of around 700 to 1000° C. to degrade the ingredient and to be a solid solution through the solid state reaction. The obtained mixture after calcined is milled in a dry condition and dried to be a preliminary sintered powder of the main component.

On the other hand, ingredients for the auxiliary component are prepared and thoroughly dried. Weight of each ingredient after drying is measured based on the stoichiometric proportion of the general formula $ABO_3$ and each ingredient is mixed in dry condition to be a mixture powder of the auxiliary component.

Then, the calcined powder of the main component dispensed and the mixture powder of the auxiliary component are dispensed so as to satisfy $0 < V < 0.01$ in the general formula $[\{Li_X(K_{1-Y}Na_Y)_{1-X}\} \ (Nb_{1-Z-W}Ta_ZSb_W)O_3]_{1-V}(ABO_3)_V$. The dispensed material is thoroughly mixed by the ball mill and dried to produce a mixture.

Then, after the obtained mixture is calcined at a temperature of about 700 to 800° C., the mixture after calcined is pulverized. An organic binder is added to the pulverized substance for pelletization and pressure forming is carried out. It is preferred that the pulverized substance after pelletization is formed by a single axis press into a pellet form and further formed by a cold isostaic press (CIP).

A compact obtain in the forgoing is sintered at a temperature of 1000 to 1300° C. to produce a sintered substance. The obtained sintered substance is cut in a predetermined size, and grinded parallel, thereafter electrodes are formed on both surfaces of a specimen by sputtering method. Then, a direct-current voltage of 1 to 6 kV/mm is applied between the electrodes in silicone oil at temperature of 8.0 to 150° C. to polarize in a thickness direction, whereby the piezoelectric ceramic composition is manufactured.

As above, according to the piezoelectric ceramic composition of the present embodiment, as the auxiliary components, by adding more than two kinds of metal elements in a combination described by $ABO_3$ (wherein A denotes Bi and B denotes at least one of Fe, In and Sc) having the perovskite structure, the coercive electric field of the obtained piezoelectric ceramic composition can be specifically enhance. As a reason that the coercive electric field is enhanced, it is known that if Bi is added solely as $Bi_2O_3$, it has a valence of +5 and tends to occupy the B site however, if it is added in a combination of $ABO_3$ (for example $BiFeO_3$), which is know to have the perovskite structure, it has a valence of +3 and tends to occupy A site.

According to the shear mode-type piezoelectric actuator using the above piezoelectric ceramic composition, by increasing the drive voltage applied to the shear mode-type piezoelectric actuator, the maximum displacement can be increased. Also, since the thickness of the shear mode-type piezoelectric actuator can be reduced, the resonance frequency of the actuator can be increased and high frequency drive is possible. Further, since the thickness of the shear mod type piezoelectric actuator can be reduced, the displacement efficiency is enhanced.

An example of a liquid droplet ejection head to which the shear mode-type piezoelectric actuator of the present invention is applied, will be described.

Figure 2:
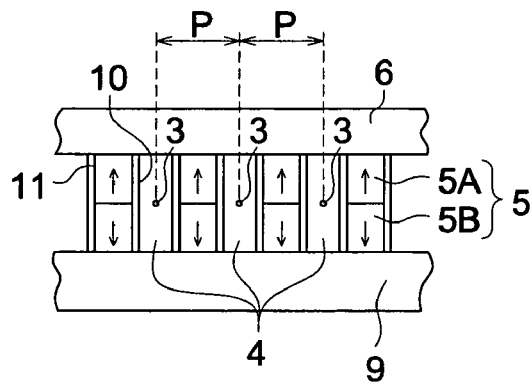
FIG. 2(*a*) and FIG. 2(*b*) show a structure of a multi nozzle liquid droplet ejection head of the first embodiment of the present invention.
Figure 2:
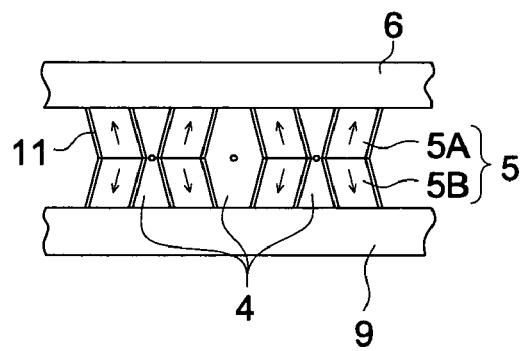

A first embodiment of the liquid droplet ejection head related to the present invention, using the above piezoelectric ceramic composition as the shear mode-type piezoelectric actuator will be described with reference to FIG. 1 to FIG. 3. Meanwhile, FIG. 1 shows a structure of the liquid droplet ejection head of the first embodiment of the present invention. FIG. 2 shows a structure of a multi nozzle liquid droplet ejection head of the first embodiment of the present invention.

Figure 3:
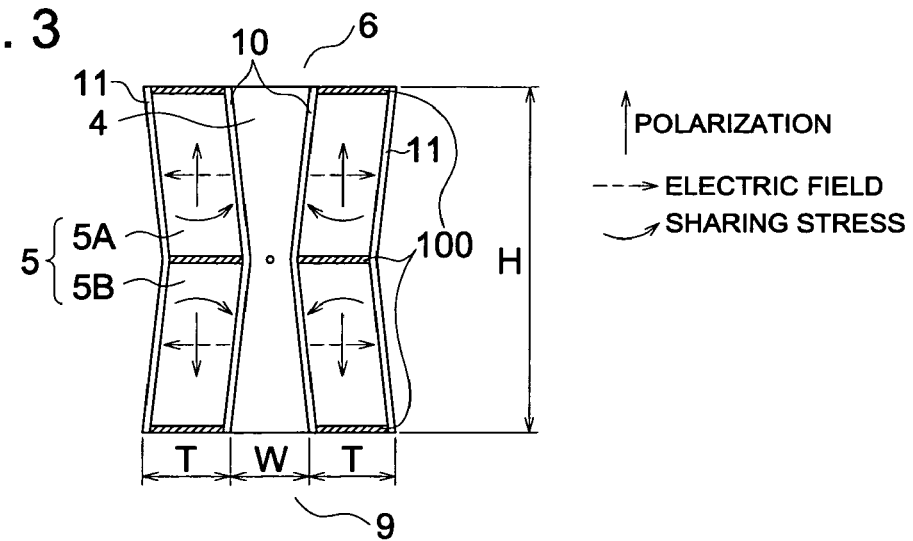
FIG. 3 shows operation of the liquid droplet ejection heads shown by FIG. 1 and FIG. 2.

FIG. 3 shows operation of the liquid droplet ejection heads shown in FIG. 1 and FIG. 2.

In the liquid droplet ejection head of the present invention, a plurality of liquid flow paths each having a nozzle for liquid ejection are disposed and divided by dividing walls. A portion of the dividing wall or an entire dividing wall is configured with the shear mode-type piezoelectric actuator. By applying a drive pulse onto the electrode, shearing distortion is caused on the dividing wall and a pressure in the flow path changes whereby a liquid droplet is ejected form a nozzle formed on an end of the flow path.

In FIGS. 1 to 3, a numeral 1 denotes a liquid tube, a numeral 2 denotes a nozzle forming member, a numeral 3 denotes a nozzle, a numeral 4 denotes a liquid flow path, a numeral 5 denotes a piezoelectric dividing wall (shear mode-type piezoelectric actuator), a numeral 6 denotes a cover plate, a numeral 7 denotes a liquid supply port, a numeral 8 denotes a common ink chamber, a numeral 9 denotes a substrate, numerals 10 and 11 are electrodes. The liquid flow path 4 is configured with the piezoelectric dividing wall 5, the cover plate 6 and the substrate 9.

First, two pieces of the piezoelectric ceramic composition which are sintered in a shape of plate and polarized in a thickness direction are prepared. Two pieces of the piezoelectric ceramic composition laid in a way that the polarization directions differ each other in respect to the substrate 9 are adhered above and below via an adhesive 100, then from an upper side, a plurality of liquid flow paths 4 in a shape of channel are formed by cutting work with a diamond blade parallel to each other all in the same shape. Whereby, the adjacent liquid flow paths 4 are divided by a piezoelectric dividing wall (shear mode-type piezoelectric actuator) 5 which are polarized in an arrow direction. Then after forming the electrodes 10 and 11 on the piezoelectric dividing wall 5 through a plating method or a vapor-phase deposition method, a cover plate 6 is adhered on an upper surface thereof, and a nozzle forming member 2 is further adhered on a front surface thereof.

In FIG. 1, while a liquid droplet ejection head having one liquid flow path and one nozzle is described, as FIG. 2(a) shows, a plurality of liquid flow path 4 are formed parallel which are divided by a plurality of the piezoelectric dividing wall 5 between the cover plate 6 and the substrate 9, an end of the liquid flow path 4 is connected to the nozzle 3 formed on the nozzle forming member 2, the other end of the liquid flow path 4 representing the liquid supply port 7 is connected to an unillustrated liquid tank through the common ink chamber 8 via the liquid tube 1. Between the electrode 10 formed and adhered on the piezoelectric dividing wall 5 and the earth electrode 11, the pulse voltage is applied.

In FIG. 2(a), the piezoelectric dividing wall 5 are configured with two piezoelectric dividing walls (shear mode-type piezoelectric actuator) 5A and 5B having different polarization directions as an arrow shows. As FIG. 2(a) shows, the piezoelectric dividing walls 5A and 5B do not distort when the drive pulse is not applied to the electrode 10. However, as FIG. 2(b) and FIG. 3 show, when the drive pulse is applied to the electrode 10, a shearing force is created by an electric field perpendicular to the polarization direction of the piezoelectric dividing wall, and shearing distortion occurs at an adhering surface of the piezoelectric dividing walls 5A and 5B, whereby by a pressure change of the liquid flow path 4, a portion of the liquid filling the liquid flow path 4 is ejected form the nozzle 3. When this occurs, an average displacement $\Delta$ and created pressure P are described in the following formula:

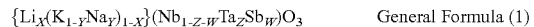

$\Delta = (\text{Piezoelectric } d_{15} \text{ constant}) \times H \times V/(4T)$

$P = (\text{Piezoelectric } d_{15} \text{ constant}) \times H \times V/(2TW(1/B)+(1/S)(dS/dP))$ Wherein, as FIG. 3 shows, a symbol H denotes a depth of the liquid flow path 4, symbol W denotes a width of the liquid flow path 4, symbol V denotes a voltage of the drive pulse, symbol T denotes a thickness of the piezoelectric dividing wall 5, symbol B denotes a volume elastic modulus coefficient of the liquid and a symbol S denotes a cross-sectional area of the liquid flow path 4.

Also, supply of liquid from the liquid tank to the nozzle via the liquid supply port and the flow path 4 after liquid droplet ejection, is carried out by a force caused by a capillary action of the nozzle.

For the piezoelectric dividing wall 5 of the liquid droplet ejection head, there are used a piezoelectric ceramic composition including a slide solution having a main component described by the general formula (1) below and an auxiliary component added in an adding amount of less than 1% by mol based on the total amount of the solid solution described by the general formula (2) below.

$$\{Li_X(K_{1-Y}Na_Y)_{1-X}\}(Nb_{1-Z-W}Ta_ZSb_W)O_3 \qquad \text{General Formula (1)}$$

(Wherein $0 \leqq x \leqq 0.2$, $0 \leqq y \leqq 1$, $0 < z \leqq 0.4$, $0 < w \leqq 0.2$)

$$ABO_3 \qquad \text{General Formula (2)}$$

(Wherein A denotes Bi and B denotes at least one of Fe, In and Sc)

By using the piezoelectric ceramic composition having the high coercive electric field as the piezoelectric dividing wall (shear mode-type piezoelectric actuator), the drive voltage applied to the piezoelectric dividing wall is increased and the maximum displacement can be increased. Also, since the thickness of the piezoelectric dividing wall can be reduced, the displacement efficiency is enhanced as the above formula of the average displacement A of the piezoelectric dividing wall reveals. Further, since the thickness of the piezoelectric dividing wall can be reduced, a nozzle pitch P (refer to FIG. 2) can be narrower and the nozzle density can be increased.

Also, since lead is not included in the composition, the hazardous lead does not leak out form industrial wastes to the nature whereby the piezoelectric ceramic composition is safety and lead free.

Figure 4:
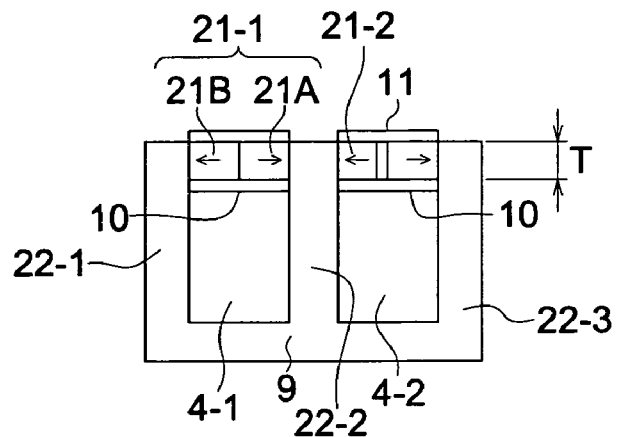
FIG. 4 shows a structure of a liquid droplet ejection head of a second embodiment of the present invention.
Figure 5:
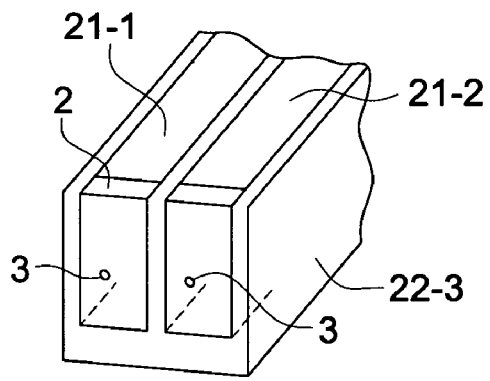
FIG. 5 is a perspective view of the liquid droplet ejection head shown in FIG. 4.
Figure 6:
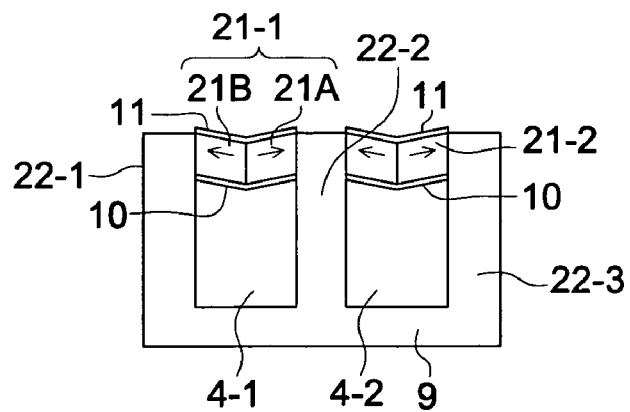
FIG. 6 shows operation of the liquid droplet ejection head shown by FIG. 4 and FIG. 5.

There will be described a second embodiment of the liquid droplet ejection head related to the present invention using the piezoelectric ceramic composition as the shear mode-type piezoelectric actuator with reference to FIG. 4 to FIG. 6. Meanwhile, FIG. 4 shows a structure of a liquid droplet ejection head of the second embodiment of the present invention. FIG. 5 is a perspective view of the liquid droplet ejection head shown by FIG. 4. FIG. 6 shows operation of the liquid droplet ejection head shown by FIGS. 4 and 5.

In the liquid droplet ejection head of the present embodiment, the liquid droplet ejection head is provide with a plurality of the liquid flow paths divided by the dividing walls having the nozzles, the liquid flow path is formed by two walls, a wall connecting the two walls and a wall where the nozzle is formed, at least one of the connecting wall is configured with the shear mode-type piezoelectric actuator, and the electrode to which the drive pulse is applied is formed on a portion of or an entire surface of the piezoelectric actuator. By applying the drive pulse onto the electrode, the piezoelectric actuator causes shearing distortion, and the pressure in the flow path changes, then liquid droplet is ejected from the nozzle formed on an end of the flow path.

In FIGS. 4 to 6, numerals 21-1 and 21-2 are the shear mode-type piezoelectric actuator combined with cover plates, a numeral 3 is the nozzle, numerals 42-1 and 4-2 are the flow paths, a numeral 9 is the substrate, a numeral 10 is the electrode to which the drive pulse is applied, a numeral 11 is the earth electrode, and numerals 22-1 and 22-2 are the side wall. The side walls 22-1 and 22-2 are formed by one piece material on the substrate 9.

In FIG. 4, while two liquid flow paths 4-1 and 4-2 are shown, in the practical liquid droplet ejection head, a required number of the liquid flow paths are provided. According to an example shown by FIG. 4, the liquid flow path 4-1 is configured with the substrate 9, the side wall 22-1 and 22-2, and the shear mode-type piezoelectric actuator 21-1. The substrate 9, the side wall 22-1 are configure with materials such as a ceramic and a glass, and the liquid flow path 4-1, 4-2 to 4-n are formed by a process such as etching.

The shear mode-type piezoelectric actuators 21-1 and 21-2 have different polarization directions as respectively shown by the arrows. Namely, it is configured with two shear mode-type piezoelectric actuators 21A and 21B having polarization directions opposite to each other. The shear mode-type piezoelectric actuators 21-1 and 21-2 operated by the drive pulse are configured by forming an electrode, to which the drive pulse is applied, on a lower surface of the shear mode-type piezoelectric actuators 21A and 21B, and by forming an earth electrode 11 on an upper surface of the shear mode-type piezoelectric actuators 21A and 21B. FIG. 4 shows a state in which the drive pulse is not applied onto the electrode 10, thus the shear mode-type piezoelectric actuators 21-1 and 21-2 are not distorted. As FIG. 6 shows, when the drive pulse is applied to the electrode 10, by an electric filed perpendicular to a polarization direction of the shear mode-type piezoelectric actuator, a shearing distortion is caused on bonding surfaces of the shear mode-type piezoelectric actuators 21-1 and 21-2, then a pressure is applied to the liquid in the liquid flow paths 4-1 and 4-2. A portion of the liquid filling the liquid flow paths 4-1 and 4-2 is ejected from the nozzle 3.

For the shear mode-type piezoelectric actuators 21-1 and 21-2 of the liquid droplet ejection head, there are used a piezoelectric ceramic composition including a slide solution having a main component described by the general formula (1) below and an auxiliary component added in an adding amount of less than 1% by mol based on the total amount of the solid solution described by the general formula (2) below.

$$\{Li_X(K_{1-Y}Na_Y)_{1-X}\}(Nb_{1-Z-W}Ta_ZSb_W)O_3 \quad \text{General Formula (1)}$$

(Wherein $0 \leqq x \leqq 0.2$, $0 \leqq y \leqq 1$, $0 < z \leqq 0.4$, $0 < w \leqq 0.2$)

$$ABO_3 \quad \text{General Formula (2)}$$

(Wherein A denotes Bi and B denotes at least one of Fe, In and Sc)

By using the piezoelectric ceramic composition such as the present embodiment having the high coercive electric field as the shear mode-type piezoelectric actuator, the drive voltage applied to the shear mode-type piezoelectric actuator is increased and the maximum displacement can be increased. Also, since the thickness of the shear mode-type piezoelectric actuator can be reduced, the resonance frequency of the shear mode-type piezoelectric actuator is enhanced, and a high frequency drive is possible. Also since the thickness of the shear mode-type piezoelectric actuator can be reduced, the displacement efficiency is enhanced.

Also, since lead is not included in the composition, the hazardous lead does not leak out form industrial wastes to the nature, whereby the piezoelectric ceramic composition is safety and lead free.

Also, the liquid droplet ejection head of the present invention can be widely used not only for inkjet used for an inkjet printer but for industrial applications such as, for example, forming of an electric circuitry, manufacturing of a color filter for a LED display and manufacturing of an organic EL display.

Examples

A piezoelectric ceramic composition related to an embodiment of the present invention was produced and the characteristic thereof was evaluated.

A manufacturing method is described specifically as follow.

As a main component of the piezoelectric composition, $Li_2CO_3$, $Na_2CO_3$, $K_2CO_3$, $Nb_2O_5$, $Ta_2O_5$ and $Sb_2O_5$ with purity of more than 99% are prepared. Then the above ingredient is thoroughly dried and dispensed so that the stoichiometric proportion satisfies $x=0.04$, $y=0.52$, $Z=0.1$, $W=0.06$. in the above general formula of $\{Li_X(K_{1-Y}Na_Y)_{1-X}\}(Nb_{1-Z-W}Ta_ZSb_W)O_3$.
Namely, the general formula becomes $\{Li_{0.04}(K_{0.48}Na_{0.52})_{0.96}\}(Nb_{0.84}Ta_{0.1}Sb_{0.06})O_3$.

Then, the dispensed ingredient is mixed in anhydro acetone for 24 hours by the ball mill, thereafter dried to obtain a mixture.

Next, the mixture is calcined at 750° C. for five hours, then the mixture pulverized by the ball mill for 24 hours. The pulverized mixture is dried to be a calcined main component powder.

On the other hand, as auxiliary components, $Bi_2O_3$, $Fe_2O_3$, $Sc_2O_3$, and $In_2O_3$ with a purity of more than 99% are prepared. Then, the above ingredient is thoroughly dried and dispensed so that the stoichiometric proportion satisfies the general formula of $ABO_3$ (wherein A denotes Bi and B denotes at least one of Fe, In and Sc). Namely, the ingredient is dispensed at a stoichiometric proportion, so that the general formula becomes $BiInO_3$, $BiScO_3$, and $BiFeO_3$, thus the ingredient becomes an auxiliary mixed component powder.

The calcined main component powder and the auxiliary mixed component powder were dispensed at a stoichiometric proportion which satisfies V=0.002, 0.004, 0.006 and 0.01 in the general formula ($\{Li_{0.04}(K_{0.48}Na_{0.52})_{0.96}\}(Nb_{0.84}Ta_{0.1}Sb_{0.06})O_3)_{1-V}(ABO_3)_V$.

As Table 1 shows, specimen No. 1 denotes an obtained piezoelectric ceramic composition to which the auxiliary component is not added. As the auxiliary component, $BiInO_3$ is added in the adding amounts of 0.2% by mol, 0.4% by mol, 0.6% by mol, and 1% by mol, to specimens No. 2, No. 3, No. 4 and No. 5, respectively in order. In the same manner, as the auxiliary component, $BiScO_3$ is added in the adding amounts of 0.2% by mol, 0.4% by mol, 0.6% by mol, and 1% by mol to specimens No. 6, No. 7, No. 8 and No. 9, respectively in order. Also $BiFeO_3$ is added in the same manner as above to specimens No. 10, to No. 13 respectively in order.

Also, As Table 2 shows, in the formula $\{Li_{0.2}(K_{0.5}Na_{0.5})_{0.8}\}(Nb_{0.84}Ta_{0.1}Sb_{0.06})O_3$, the specimens to which the auxiliary component is not added, is denoted by No. 14. In the same manner, the specimens to which $BiFeO_3$ representing the auxiliary is added, are No. 15 to No. 18 in order of the adding amount. Also, in the formula $\{Li_{0.1}(K_{0.5}Na_{0.5})_{0.9}\}(Nb_{0.64}Ta_{0.3}Sb_{0.06})O_3$ the specimen to which the auxiliary component is not added is denoted by No. 19. The specimen to which the auxiliary component is added in an amount of 0.6% by mol is denoted by No. 20.

TABLE 1

| | Sample No. | Main component | Mol ratio | Auxiliary component | Mol ratio | d15 (pc/n) | Ec (kv/mm) |
|---|---|---|---|---|---|---|---|
| Comparison example | 1 | $\{Li_x(K_{1-y}Na_y)_{1-x}\}(Nb_{1-z-w}Ta_zSb_w)O_3$ x = 0.04, y = 0.52, z = 0.1, w = 0.06 | 1 | Nil | 0 | 273 | 11.2 |
| Present invention | 2 | | 0.998 | $Bilno_3$ | 0.002 | 269 | 13.1 |

TABLE 1-continued

| Sample No. | | Main component | Mol ratio | Auxiliary component | Mol ratio | d15 (pc/n) | Ec (kv/mm) |
|---|---|---|---|---|---|---|---|
| Present invention | 3 | | 0.996 | | 0.004 | 277 | 13.5 |
| Present invention | 4 | | 0.994 | | 0.006 | 281 | 12.3 |
| Comparison example | 5 | | 0.99 | | 0.01 | A dense sintered object | |
| Present invention | 6 | | 0.998 | Bisco$_3$ | 0.002 | 273 | 15.1 |
| Present invention | 7 | | 0.996 | | 0.004 | 269 | 11.5 |
| Present invention | 8 | | 0.994 | | 0.006 | 269 | 11.6 |
| Comparison example | 9 | | 0.99 | | 0.01 | A dense sintered object | |
| Present invention | 10 | | 0.998 | Bifeo$_3$ | 0.002 | 270 | 18.6 |
| Present invention | 11 | | 0.996 | | 0.004 | 275 | 15.6 |
| Present invention | 12 | | 0.994 | | 0.006 | 282 | 16.8 |
| Comparison example | 13 | | 0.99 | | 0.01 | A dense sintered object | |

TABLE 2

| Sample no. | | Main component | Mol ratio | Auxiliary component | Mol ratio | d15 (PC/N) | Ec (kv/mm) |
|---|---|---|---|---|---|---|---|
| Comparison example | 14 | {Li$_x$(K$_{1-y}$Na$_y$)$_{1-x}$}(Nb$_{1-z-w}$Ta$_z$Sb$_w$)O$_3$ x = 0.2, y = 0.5, z = 0.1, w = 0.06 | 1 | Nil | 0 | 162 | 11.1 |
| Present invention | 15 | | 0.998 | Bifeo$_3$ | 0.002 | 225 | 12.6 |
| Present invention | 16 | | 0.996 | | 0.004 | 274 | 14.8 |
| Present invention | 17 | | 0.994 | | 0.006 | 182 | 11.4 |
| Comparison example | 18 | | 0.99 | | 0.01 | 98 | 10.9 |
| Comparison example | 19 | {Li$_x$(K$_{1-y}$Na$_y$)$_{1-x}$}(Nb$_{1-z-w}$Ta$_z$Sb$_w$)O$_3$ x = 0.1, y = 0.5, z = 0.3, w = 0.06 | 1 | Nil | 0 | 189 | 12.7 |
| Present invention | 20 | | 0.994 | Bifeo$_3$ | 0.006 | 233 | 14.1 |

The dispensed piezoelectric ceramic composition is mixed in anhydro acetone for 24 hours by the ball mill, thereafter dried to obtain a mixture.

Next, the mixture is calcined at 700° C. to 800° C. for five hours, then the mixture after calcined is pulverized by the ball mill for 24 hours. Subsequently, as a binder, a polyvinyle butyral is added and pelletized then formed by pressure. In pressure forming, the pelletized pulverized object is pressed by the single axis press forming to be a pellet shape and further pressed by a cold isostaic press (CIP) at a pressure of 1 ton/cm$^2$.

The formed object obtained by the above method, is sintered at 1000 to 1300° C. for one hour to produce a sinterings object. Meanwhile, the sinterings temperature is set at a temperature between 1000 to 1300° C. where a maximum density is obtained. Here, in the formula {Li$_{0.04}$ (K$_{0.48}$Na$_{0.52}$)$_{0.96}$}(Nb$_{0.84}$Ta$_{0.1}$Sb$_{0.06}$)O$_3$, the specimen to which the auxiliary composition is added in the amount of 1% by mol was not able to produce a densely sintered object.

Also, by powder X-ray diffraction (XRD), identification of crystal phase is carried out for the obtained sintered object. In the sintered object configured with the piezoelectric ceramic composition of the present invention, a diffraction peak showed the perovskite structure single layer, and is consecutively shifted along with the adding amount of the auxiliary component, from the above results, creation of the solid solution is confirmed.

Next, the obtained sintered object is cut in a predetermined size and grinded parallel to a thickness of approximately 0.5 mm. Thereafter, metal electrode is formed by spattering method on both surface of the specimen. The direct current voltage of 1 to 6 kV is applied between the electrodes for ten minutes in silicone oil at a temperature of 80 to 150° C. to polarize in a thickness direction and the piezoelectric ceramic composition is produced.

Next, a piezoeoectric d$_{15}$, constant, and a coercive electric field Ec are measured for the specimens No. 1 to No. 20. Here the piezoelectric d$_{15}$ constant is measured through resonance-antiresonance method by an impedance analyzer (Agilent Technologies 4294A).

The coercive Ec is measured in the following method. P-E hystereisys is measured by ferroelectric substance characteristic evaluation system (Radiant Technologies) in a room temperature. Hysteresis curves were obtained by applying 1 kV, 2 kV, 3 kV and 4 kV onto each specimen. From the hysteresis curve, an electrofield intensity when the polarization amount is zero is obtained, which is the coercive electric field Ec. The results are shown in Tables 1 and 2.

As Tables 1 and 2 reveal, in the piezoelectric ceramic composition of the present invention, the coercive electric field Ec increase while the piezoelectric d$_{15}$ constant stays almost the same. Thereby, the drive voltage to be applied to the shear mode-type piezoelectric actuator using the piezoelectric ceramic composition can be increased so as to increase the maximum displacement. Also, the thickness of the shear mode-type piezoelectric actuator can be reduced, the resonance frequency can be increased thus high frequency drive is possible. Also, since the thickness of the shear mode-type piezoelectric actuator can be reduced, the displacement efficiency can be enhanced.

Also, according to the liquid droplet ejection head provided with the shear mode-type piezoelectric actuator of the present invention, the maximum displacement can be increased by increasing the drive voltage to be applied onto the shear mode-type piezoelectric actuator. Also, the thickness of the shear mode-type piezoelectric actuator can be reduced, the resonance frequency can be increased, thus high frequency drive is possible. Also, since the thickness of the shear mode-type piezoelectric actuator can be reduced, the displacement efficiency can be enhanced. Further, in case the shear mode-type piezoelectric actuator is used for the dividing wall of the liquid flow path, the thickness of the dividing wall can be reduced, thus nozzle density can be increased.

In the formula $\{Li_{0.04}(K_{0.48}Na_{0.52})_{0.96}\}(Nb_{0.84}Ta_{0.1}Sb_{0.06})O_3$ in particular, while the piezoelectric $d_{15}$ constant of the specimens No. 10 to 12 to which $BiFeO_3$ is added as the auxiliary component stays almost the same, the coercive electric field is further increased. Thereby the maximum displacement can be increased by increasing the drive voltage to be applied onto the shear mode-type piezoelectric actuator. Also, the thickness of the shear mode-type piezoelectric actuator can be reduced, the resonance frequency can be increased, thus high frequency drive is possible. Also, since the thickness of the shear mode-type piezoelectric actuator can be reduced, the displacement efficiency can be further enhanced.

According to the liquid droplet ejection head provided with the shear mode-type piezoelectric actuator of the present invention, the maximum displacement can be increased by increasing the drive voltage to be applied onto the shear mode-type piezoelectric actuator. Also, the thickness of the shear mode-type piezoelectric actuator can be reduced, the resonance frequency can be increased, thus high frequency drive is possible. Also, since the thickness of the shear mode-type piezoelectric actuator can be reduced, the displacement efficiency can be further enhanced. Further, in case the shear mode-type piezoelectric actuator is used for the dividing wall of the liquid flow path, the thickness of the dividing wall can be reduced, thus nozzle density can be increased.

Also, in the present embodiment, as the main component, while $\{Li_{0.4}K_{0.48}Na_{0.52}\}_{0.96}(Nb_{0.84}Ta_{0.1}Sb_{0.06})O_3$, $\{Li_{0.2}(K_{0.5}Na_{0.5})_{0.8}\}(Nb_{0.84}Ta_{0.1}Sb_{0.06})O_3$ and $\{Li_{0.1}(K_{0.5}Na_{0.5})_{0.9}\}(Nb_{0.64}Ta_{0.3}Sb_{0.06})O_3$ are used, the compound within the rages of $0 \leq x \leq 0.2$, $0 \leq y \leq 1$, $0 < z \leq 0.4$ and $0 < w \leq 0.2$ in the general formula $\{Li_X(K_{1-Y}Na_Y)_{1-X}\}(Nb_{1-Z-W}Ta_ZSb_W)O_3$ can be used as the main component, and the same effect can be obtained.

Also, in the present embodiment, while the auxiliary component is added as the auxiliary component mixture powder, the same effect can be obtained by adding the auxiliary component temporally sintered in advance as the auxiliary component temporally sintered powder.

What is claimed is:

1. A shear mode-type piezoelectric actuator comprising a piezoelectric ceramic composition including a solid solution composed of a main component described by a following general formula (1) and an auxiliary component described by a following general formula (2) added in an amount of less than 1% by mole based on a total amount of the solid solution, $\{Li_X(K_{1-Y}Na_Y)_{1-X}\}(Nb_{1-Z-W}Ta_ZSb_W)O_3$   General Formula (1)

(Wherein $0 \leq x \leq 0.2$, $0 \leq y \leq 1$, $0 < z \leq 0.4$, $0 < w \leq 0.2$)

$ABO_3$   General Formula (2)

(Wherein A denotes Bi and B denotes at least one of Fe, In and Sc).

2. The shear mode-type piezoelectric actuator of claim 1, wherein the solid solution has a perovskite structure.

3. A liquid droplet ejection head, comprising the shear mode-type piezoelectric actuator of claim 1.

4. The liquid droplet ejection head of claim 3, further comprising
a plurality of liquid flow paths divided by dividing walls, wherein each liquid path has a nozzle to eject a liquid droplet and a portion of the dividing wall or the entire dividing wall is configured with the shear mode-type piezoelectric actuator.

5. A liquid droplet ejection head, comprising the shear mode-type piezoelectric actuator of claim 2.

6. The liquid droplet ejection head of claim 5, further comprising
a plurality of liquid flow paths divided by dividing walls, wherein each liquid path has a nozzle to eject a liquid droplet and a portion of the dividing wall or the entire dividing wall is configured with the shear mode-type piezoelectric actuator.

* * * * *